United States Patent [19]
Scheler et al.

[11] Patent Number: 6,000,732
[45] Date of Patent: *Dec. 14, 1999

[54] ARRANGEMENT FOR LOCKING AND UNLOCKING A DOOR OF A CONTAINER

[75] Inventors: Werner Scheler; Karl Schubert; Andreas Mages; Andreas Anton, all of Jena, Germany

[73] Assignee: Jenoptik AG, Jena, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/649,263

[22] Filed: May 17, 1996

[30] Foreign Application Priority Data

Sep. 22, 1995 [DE] Germany ............. 195 35 178

[51] Int. Cl.[6] ........................................ E05C 5/00
[52] U.S. Cl. ............................. 292/68; 292/6
[58] Field of Search .............. 292/4–6, 57–59, 292/63, 66, 68, 156, 157, 256.5, DIG. 11, 71, 159; 220/245, 251, 323

[56] References Cited

U.S. PATENT DOCUMENTS

| | | | |
|---|---|---|---|
| 1,303,087 | 5/1919 | Lutz | 292/5 |
| 1,375,134 | 4/1921 | Davis | 292/5 |
| 1,375,645 | 4/1921 | Unckrich | 292/5 |
| 1,929,341 | 10/1933 | Wegner | 292/5 |
| 2,195,542 | 4/1940 | Shaffer | 292/66 |
| 3,324,817 | 6/1967 | Olsson | 292/256.5 |
| 3,421,471 | 1/1969 | Richter | 292/256.5 |
| 3,767,239 | 10/1973 | Horgan | 292/66 |
| 3,786,657 | 1/1974 | Loikitz | 292/14 |
| 4,543,748 | 10/1985 | North | 292/6 |
| 4,893,849 | 1/1990 | Schlack | 292/66 |
| 4,964,755 | 10/1990 | Lewis | 292/66 |

FOREIGN PATENT DOCUMENTS

| | | |
|---|---|---|
| 570705 | 9/1923 | France . |
| 2692170 | 12/1993 | France . |
| 39 30 868C2 | 3/1991 | Germany . |
| 4207341 | 7/1993 | Germany . |
| WO8600870 | 2/1986 | WIPO . |
| WO93 18543A2 | 9/1993 | WIPO . |

*Primary Examiner*—Flemming Saether
*Assistant Examiner*—Gary Estremsky
*Attorney, Agent, or Firm*—McAulay Nissen Goldberg Kiel & Hand, LLP

[57] ABSTRACT

An arrangement for locking and unlocking a door of a container for increasing operating reliability when locking and unlocking in a simple manner and for ensuring an opening and closing of the transport container in automated operation. Particle generation is reduced at the same time. Locking elements within a door, which can move in and out, penetrate into recesses of the container to be closed when moved out along a curved path. The arrangement is particularly applicable in transport containers for wafer-shaped objects of larger diameter, in which removal and charging are effected individually in a plane parallel to the surface of the wafer-shaped object and whose container cover is removed and inserted laterally.

4 Claims, 4 Drawing Sheets

ARRANGEMENT FOR LOCKING AND UNLOCKING A DOOR OF A CONTAINER

BACKGROUND OF THE INVENTION a) Field of the Invention

The invention is directed to an arrangement for locking and unlocking a door of a container, in particular containers for transporting wafer-shaped objects, with locking elements within the door which can move in and out and which, when moved out, penetrate into recesses of the container to be closed. The invention is especially applicable in the semiconductor industry, but can also be used in the manufacture of flat display screens. A technical solution of this kind is known from U.S. Pat. No. 4,995,430, for example.

b) Description of the Related Art

For the purpose of charging semiconductor processing installations, so-called SMIF boxes are frequently used as magazine containers in which semiconductor wafer magazines can be stored and transported. The box can be placed on an opening mechanism in an enclosure which encloses one or more work stations so as to keep them free of dust. The box and opening mechanism have closing elements which are adapted to one another and which can be opened simultaneously one above the other so that dust particles resting on the outside of the closing elements can be enclosed therebetween when the semiconductor wafer magazines are lowered into the enclosure together with the two closing elements. The box itself encloses the opening formed in the enclosure.

The locking mechanism disclosed in U.S. Pat. No. 4,995,430 for opening and closing a SMIF box of this kind operates in consecutive steps in which a locking mechanism occupies three different positions. The first position corresponds to a moved-in state and the second position corresponds to a fully moved-out state. In the fully moved-out position, the closing of the SMIF box is effected by a tilting of the locking element, which is constructed as a lever, so as to prevent particles generated by friction from occurring in the locking region. However, the formation of particles is not prevented in the regions of actuation, since wedges are pushed under the other end of the lever in order to tilt the locking mechanism.

The technique of SMIF boxes is especially suited for semiconductor wafers with conventional smaller diameters. In view of the material characteristics of the semiconductor wafers, these SMIF boxes and the semiconductor wafer magazines used with them are becoming increasingly less suitable as transporting containers as the diameter of semiconductor wafers increases. Transporting containers which simultaneously perform the function of magazines are already known for semiconductor wafers of this type. Removal and charging of the semiconductor wafers is effected individually in a plane parallel to the surface of the semiconductor wafers, wherein the transporting container can be closed by a container cover which is directed substantially at right angles to the removal and charging plane. Accordingly, in contrast to the SMIF box, the container cover is removed and inserted laterally rather than in a downward direction.

Current known transport containers which are also subject to the requirement that particle formation be avoided when opening and closing have the disadvantage that the container cover can often only be opened with difficulty, if at all. For a dependable operation, known locking and unlocking elements which act separately and which have favorable results with respect to clean rooms due to their vacuum actuation and the possibility of encapsulation must be provided with sensors which signal a failure. Moreover, overcoming failures in automated operation results in additional costs.

OBJECT AND SUMMARY OF THE INVENTION

Therefore, the primary object of the present invention is to increase operating reliability when locking and unlocking in a simple manner such that an opening and closing of the transport container in automated operation is ensured. Particle generation is to be reduced at the same time.

In an arrangement for locking and unlocking a door of a container, in particular containers for transporting wafer-shaped objects, with locking elements within the door which can be moved in and out and which, when moved out, penetrate into recesses of the container to be closed, this object is met in that the penetration of the locking elements into the recesses is effected along a curved path.

A curved path of this kind can be advantageously produced by technical means without the use of wedges. For this purpose, every locking element is connected with the outwardly directed wall of the door by couplers which are rotatably supported in parallelogram construction at the locking element and also at the wall so that, as a result of the couplers, there is a determined distance between the locking element and the wall in the moved-in state, which distance decreases when the locking elements are moved out until the latter contact a contact surface in the recess.

After the locking elements have reached the state in which they contact the contact surface in the recess without significant frictional effects, the locking element is finally fixed so as to be pressed upon under tension so that the container with the door is closed.

In an advantageous manner, locking elements which are adjacent to one another are a structural component part of a plate which is directed parallel to the outwardly directed wall of the door, wherein all plates share a common drive for displacing elements which acts in the locking and unlocking direction, the plates being fixed in the moved-in end position and in the moved-out end position by means of these displacing elements.

For reasons relating to space requirements, it can also be advantageous if every locking element is a structural component part of a plate which is directed parallel to the outwardly directed wall of the door, wherein all plates share a common drive for displacing elements which acts in the locking and unlocking direction, the plates being fixed in the moved-in end position and in the moved-out end position by means of these displacing elements.

In either case, the displacing elements can be constructed as connecting rods, one end of which is rotatably fitted to a plate, the other end being rotatably fitted opposite thereto at a disk so as to lie outside the axis. The plates are fixed in the moved-out end position by rotating the disk beyond the dead center position.

The invention will be explained more fully in the following with reference to the schematic drawings.

DESCRIPTION OF THE PREFERRED EMBODIMENTS

Figure 1:
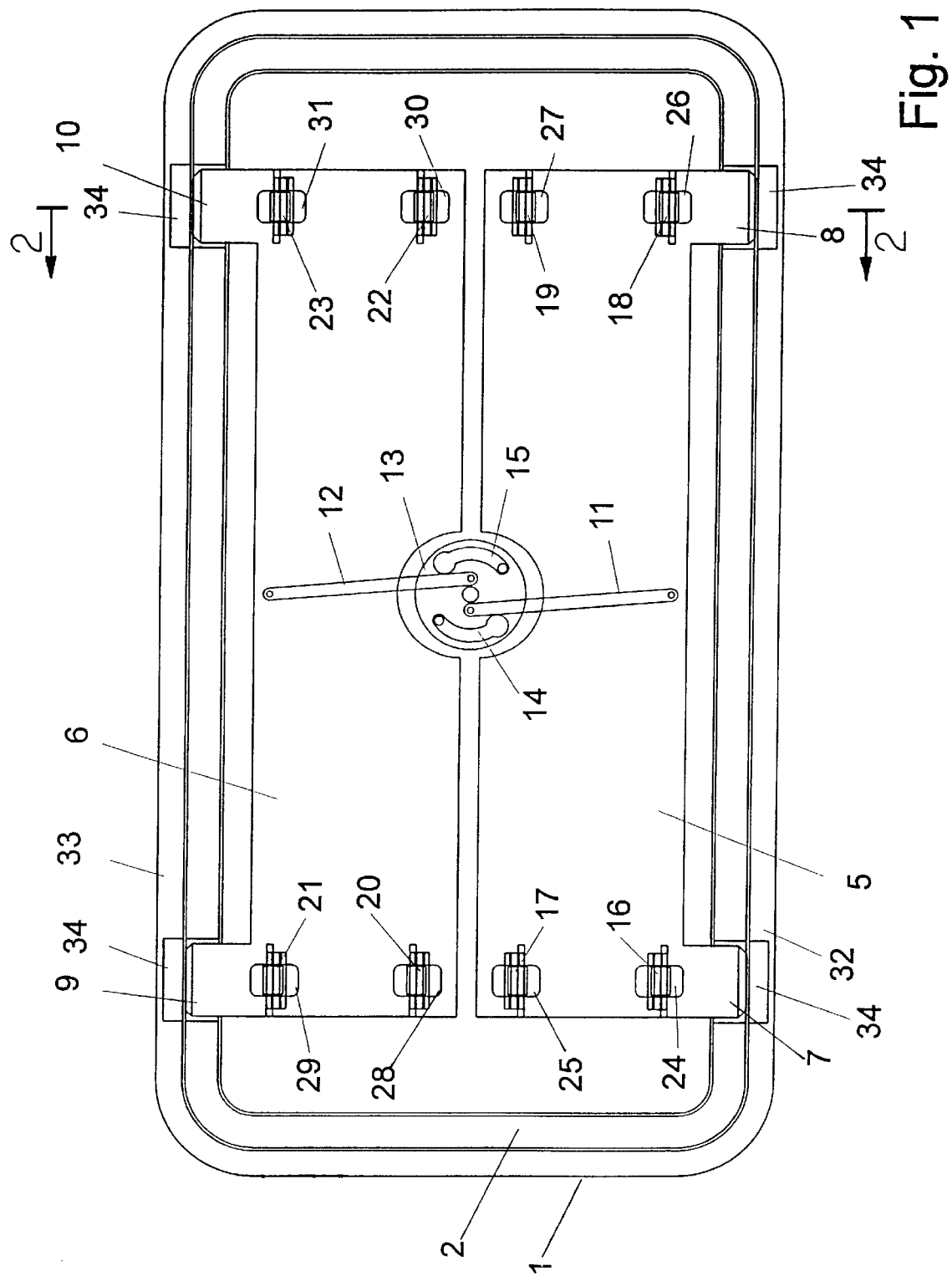
FIG. 1 shows a top view of a door with an arrangement for locking and unlocking in a first construction in the moved-in state.
Figure 2:
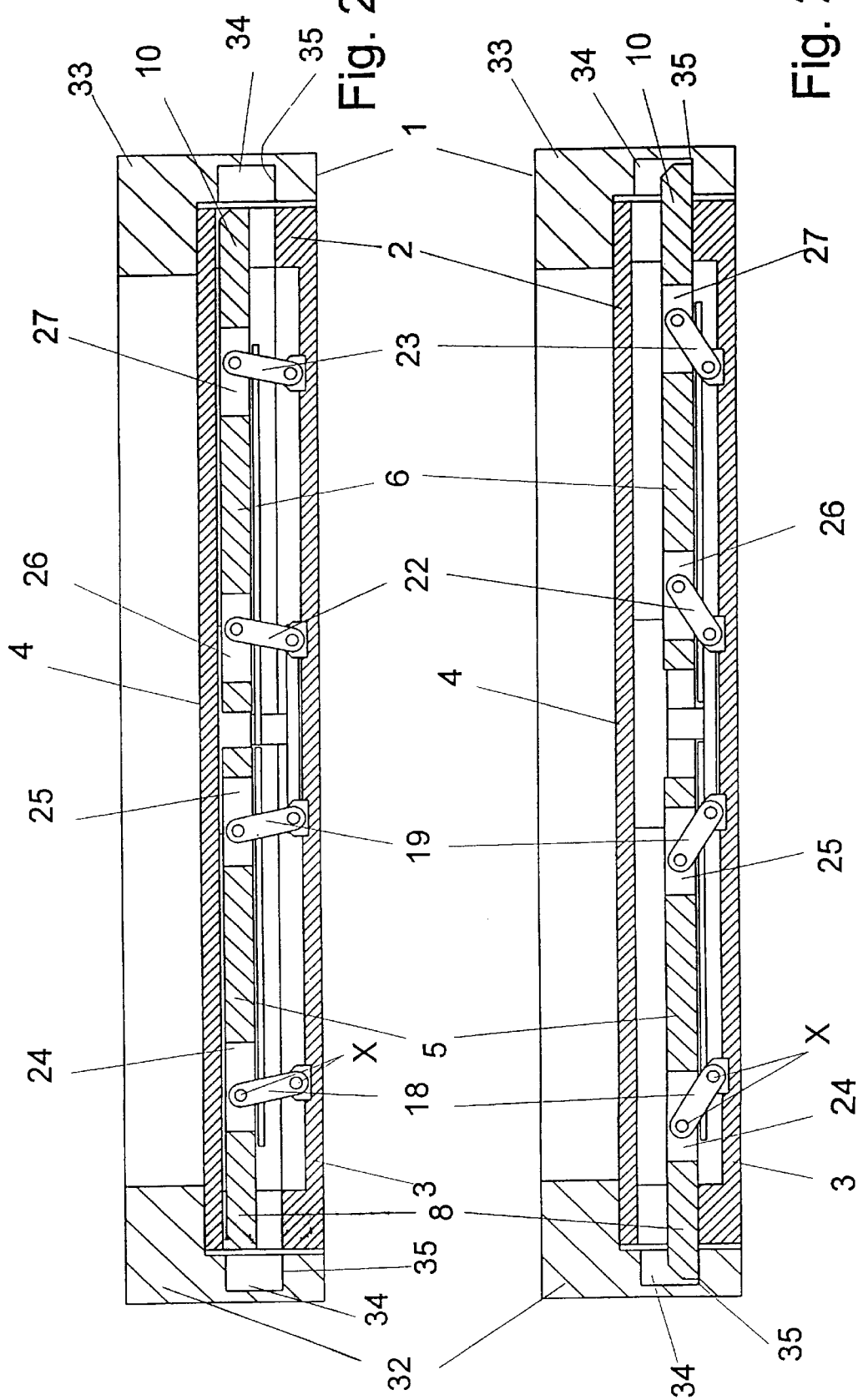
FIG. 2a shows a sectional view of the arrangement in the moved-in state.
FIG. 2b shows a sectional view of the arrangement in the moved-out state.

In FIGS. 1, 2a and 2b, a door 2 with an arrangement for locking and unlocking, which is situated between walls 3, 4, is fitted in a container 1. The arrangement substantially comprises two plates 5, 6 which have, at their outwardly directed sides, locking elements 7, 8 and 9, 10 in the form of projections. The plates 5 and 6 which lie parallel to the walls 3, 4 share a common drive acting in the locking and unlocking direction for displacing elements 11, 12 in the form of connecting rods, the plates 5, 6 being fixed in the moved-in end position and in the moved-out end position (see FIGS. 2a and 2c) by means of these displacing elements when the latter are displaced. Of the shared drive, only a rotatable disk 13 is shown in FIG. 1. The displacing elements 11 and 12 are rotatably fitted by one end in each instance to the disk 13 so as to lie outside the axis. The other end is rotatably fitted to a plate 5 and 6, respectively. Circular grooves 14, 15 are worked into the disk 13. Pins, not shown, which project out of a rotating disk engage in the grooves 14, 15 in order to rotate the disk 13. A motor serving to drive the rotating disk is arranged outside of the container 1 and door 2. A signal transmitter, also not shown, at the rotating disk for detecting the two end positions ensures reliable operation of the arrangement, since the rest of its component parts are connected with one another.

As is shown in FIGS. 2a and 2b in conjunction with FIG. 1, every locking element 7, 8, 9 and 10 or the regions of the plates 5 and 6 in which the locking elements 7, 8, 9 and 10 are provided is connected with the outwardly directed wall 3 of the door 2 by couplers 16, 17, 18, 19, 20, 21, 22 and 23 which are supported in parallelogram construction at the locking element 7, 8, 9 and 10, respectively, and at the wall 3 so as to be rotatable about axes X at right angles to the locking and unlocking direction. For the sake of simplicity, only one of the axes X is shown. Further, cut out portions 24, 25, 26, 27, 28, 29, 30 and 31 which assist in the locking function are provided in the region of the fastenings of the couplers 16, 17, 18, 19, 20, 21, 22 and 23, at least in the plates 5 and 6.

Recesses 34 which leave open sufficient space for the movement of the locking elements 7, 8, 9 and 10 during the locking and unlocking process are worked into the container walls 32 and 33 in the region of the door 2 which is fitted therein. The locking elements 7, 8, 9 and 10 are supported on contact surfaces 35 in the locked state and accordingly in the closed state of the container 1 (FIG. 2b).

Figure 3:
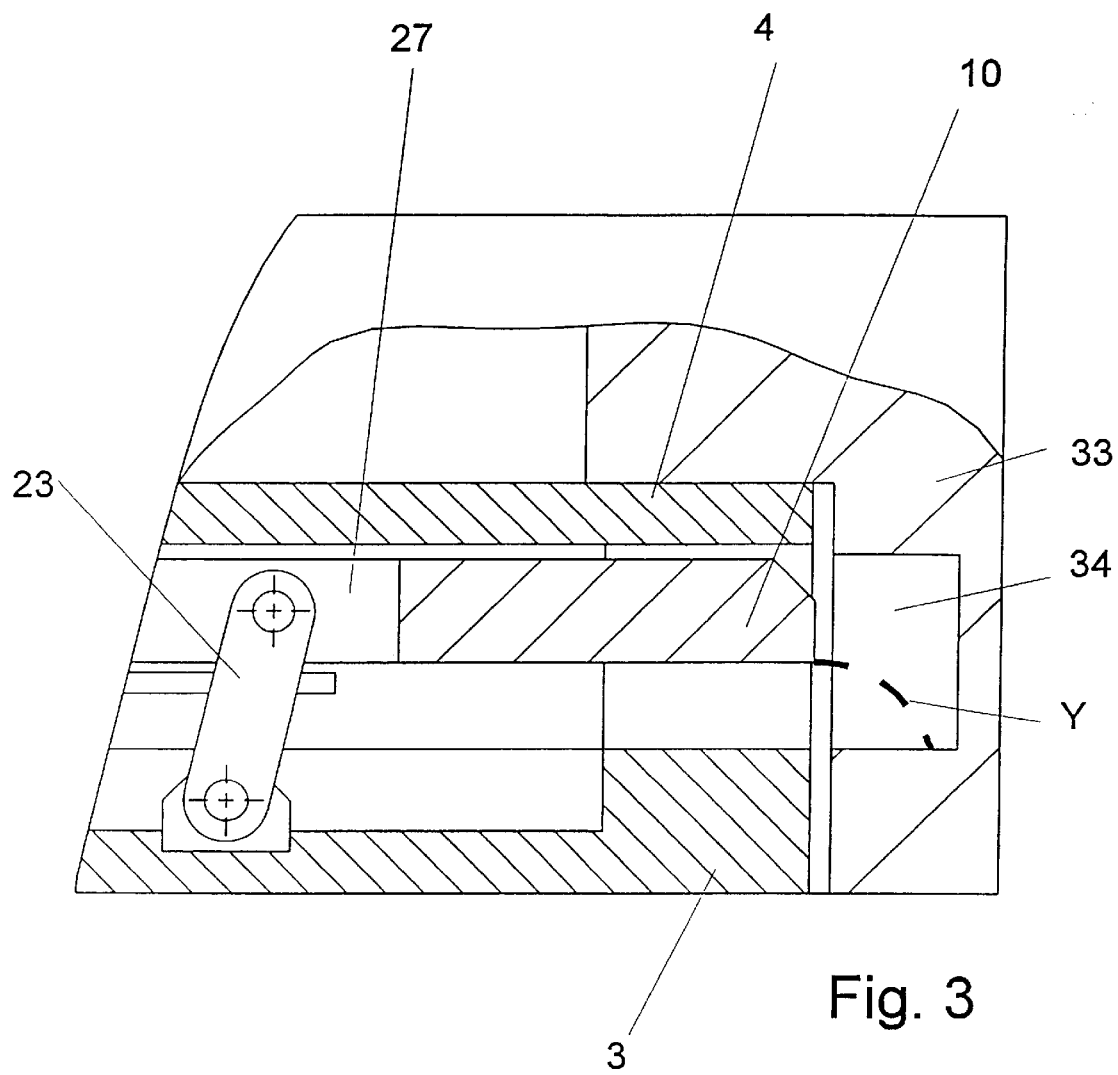
FIG. 3 shows moving out process along a curved path.

The container 1 is locked by the described arrangement in the following manner. When the disk 13 is rotated, in that it is driven by the motor via the pins engaging in the grooves 14, 15, the displacing elements 11 and 12 which are fastened in such a way that they lie outside the axis are moved outward so that the plates 5 and 6 are accordingly also moved out. However, as will be seen from FIG. 3, they follow a curved path Y rather than a linear path. As a result of the sufficiently high movement space, the locking elements 7, 8, 9 and 10 can penetrate without hindrance into the recesses 34 until contacting the contact surfaces 35. The locking elements 7, 8, 9 and 10 are pressed against the contact surfaces 35 under tension and subsequently fixed by means of a slight residual rotating movement of the disk 13 beyond the dead center of the displacing elements 11 and 12. Just as in the case of the penetrating movement until contact is made, there is also essentially no frictional action involved in this contact pressure accompanied by tension.

A seal can, of course, be provided between the container 1 and the door 2 for the purpose of a tightly fitting connection. It is also advantageous when the contact surfaces 35 project beyond the wall 3 slightly when the door 2 is inserted. Unlocking is effected in the reverse sequence, wherein the locking elements 7, 8, 9 and 10 are also fixed in the unlocked end position.

Figure 4:
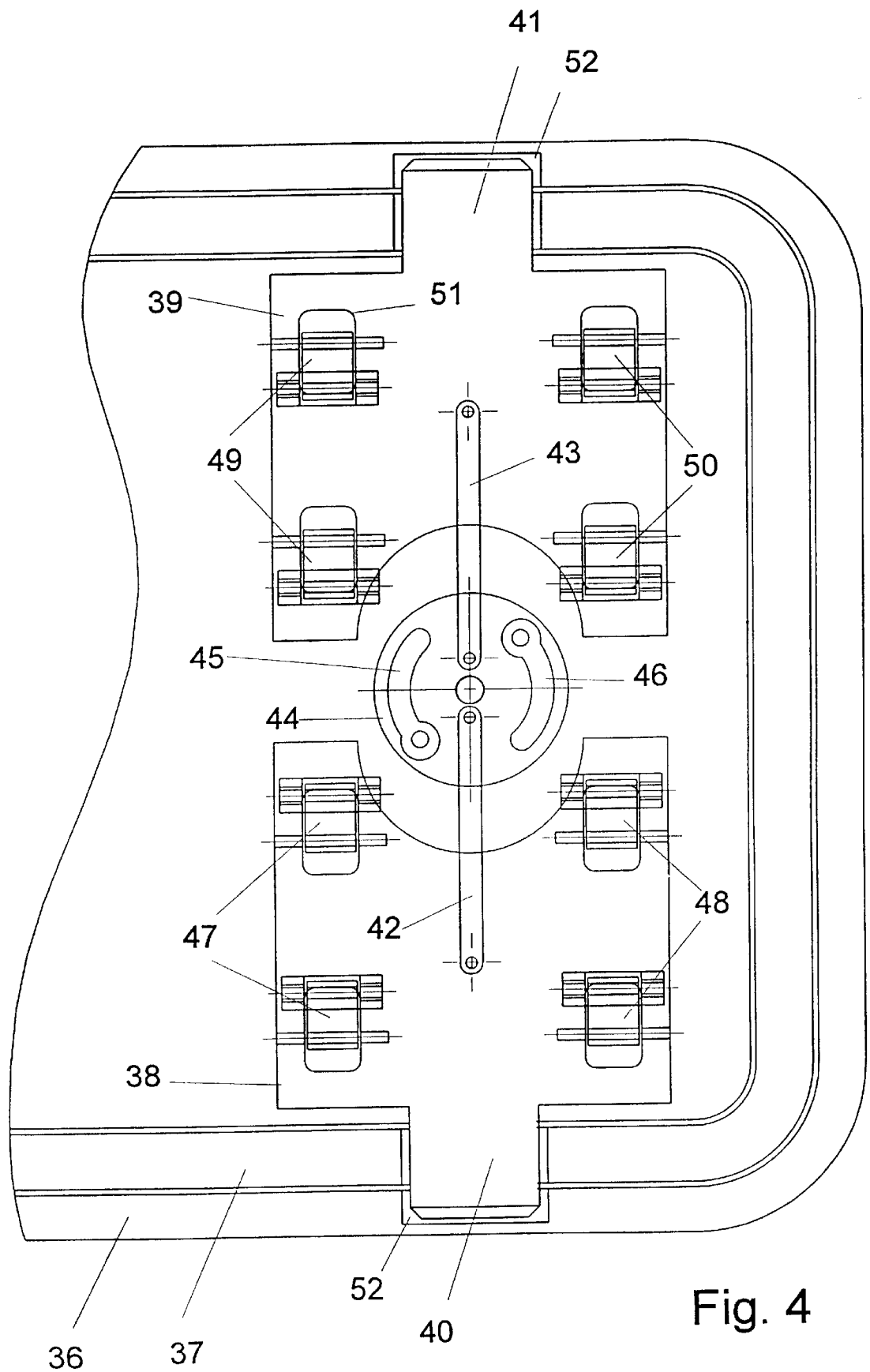
FIG. 4 shows a top view of a partial region of a door with an arrangement for locking and unlocking in a second construction in the moved-out state.

The cut off portion of the arrangement which is designed identically in a mirror-inverted manner is dispensed with in the construction according to FIG. 4. A door 37 which likewise contains the locking and unlocking arrangement between walls is fitted in a container 36. Two plates 38, 39 which are arranged adjacent to one another and which lie parallel to the walls of the door 37 have, at their outwardly directed sides, locking elements 40, 41 in the form of projections. A shared drive acting in the locking and unlocking direction for displacing elements 42, 43 in the form of connecting rods is provided for displacing the plates 38, 39 relative to one another and to fix them in the end positions.

Of the shared drive, only a rotatable disk 44 is shown. The displacing elements 42 and 43 are rotatably fitted by one end in each instance to the disk 44 so as to lie outside the axis. They are fastened by their other end to a plate 38 and 39, respectively. Circular grooves 45, 46 are worked into the disk 44. Pins, not shown, which project out of a rotating disk engage in the grooves 45, 46 in order to rotate the disk 44. A motor serving to drive the rotating disk is arranged outside of the container 36 and door 37. A signal transmitter, also not shown, at the rotating disk serves to detect the two end positions.

In contrast to the first embodiment according to FIG. 1 and for reasons of stability, each locking element 40, 41 and each of the plates 38, 39 is provided with a pair of couplers 47, 48, 49, 50 in parallelogram construction for connecting with the outwardly directed wall of the door 37. In other respects, the couplers 47, 48, 49, 50 and their fastening are identical to the first embodiment. This also applies to the cut out portions which are incorporated at least in the plates 38, 39 and which assist in locking. Only one cut out portion, designated by 51, is shown.

Recesses 52 with corresponding contact surfaces and sufficient space for the movement of the locking elements 40, 41 are worked into the walls of the container 36 in the region of the inserted door 37.

Of course, it is possible to select a drive other than that described in this construction for producing the inward and outward movement, or to design the couplers of the locking elements differently, or to modify the quantity of coupled locking elements.

While the foregoing description and drawings represent the preferred embodiments of the present invention, it will be obvious to those skilled in the art that various changes and modifications may be made therein without departing from the true spirit and scope of the present invention.

What is claimed is:

1. An arrangement including in combination,
    a container for transporting wafer-shaped objects having container walls;
    a container door fitted in said container and comprising two walls, spaced apart from and parallel to each other;
    recesses worked into the container walls in the region of said container door which is fitted therein;

means for locking and unlocking said container door comprising locking elements provided within said container door between said two parallel walls and being displaceable into a moved-in end position and into a moved-out end position and, when moving out, penetrate into said recesses within the container walls, every locking element being in the form of a projection from a plate which is directed parallel to the outwardly directed wall of said container door, wherein all plates share a common drive in form of a rotatable disk driven by a motor and acting in the locking and unlocking direction for connecting rods provided for displacing the plates, the plates being fixed in the moved-in end position and in the moved-out end position by said connecting rods;

means for providing that the penetration of the locking elements into said recesses is effected along a curved path as a result of a movement of each locking element into a corresponding recess as well as in a direction normal thereto, said means for providing a curved path further comprising structure to maintain and move every plate parallel to an outwardly directed wall of said two parallel walls of the container door by means of couplers, said couplers for every plate being parallel to each other and rotatably connected to said plate and also to said outwardly directed wall so that, as a result of the couplers, there is a predetermined distance between every plate and said outwardly directed wall in the moved-in state, which distance decreases during the outward movement until the locking element comes into contact with a contact surface in the recess against which the locking element is pressed under tension in its moved-out end position.

2. The arrangement according to claim 1, wherein the locking elements are adjacent to one another.

3. The arrangement according to claim 2, wherein one end of each connecting rod is rotatably fitted to a plate, the other end being rotatably fitted opposite thereto at a disk so as to lie outside an axis thereof, and wherein the plates are fixed in the moved-out end position by rotating the disk beyond a dead center position.

4. The arrangement according to claim 1, wherein one end of each connecting rod is rotatably fitted to a plate, the other end being rotatably fitted opposite thereto at a disk so as to lie outside an axis thereof, and wherein the plates are fixed in the moved-out end position by rotating the disk beyond a dead center position.

* * * * *